United States Patent [19]

Garrett

[11] Patent Number: 4,552,639
[45] Date of Patent: Nov. 12, 1985

[54] MAGNETRON SPUTTER ETCHING SYSTEM

[75] Inventor: Charles B. Garrett, San Jose, Calif.

[73] Assignee: Varian Associates, Inc., Palo Alto, Calif.

[21] Appl. No.: 712,452

[22] Filed: Mar. 13, 1985

Related U.S. Application Data

[63] Continuation of Ser. No. 632,790, Jul. 20, 1984, abandoned.

[51] Int. Cl.⁴ .............................................. C23C 15/00
[52] U.S. Cl. .................. 204/298; 204/192 R
[58] Field of Search ............................ 204/298, 192 R

[56] References Cited

U.S. PATENT DOCUMENTS

| | | | |
|---|---|---|---|
| 4,025,410 | 5/1977 | Stewart | 204/298 |
| 4,162,954 | 7/1979 | Morrison | 204/298 |
| 4,239,611 | 12/1980 | Morrison | 204/298 |
| 4,243,505 | 1/1981 | Penfold | 204/298 |
| 4,265,729 | 5/1981 | Morrison | 204/298 |
| 4,444,643 | 4/1984 | Garrett | 204/298 |

FOREIGN PATENT DOCUMENTS 2707144 8/1977 Fed. Rep. of Germany ...... 204/298

OTHER PUBLICATIONS

Okano et al., Solid State Technol., Apr. 1982, pp. 166–170.

Primary Examiner—Arthur P. Demers
Attorney, Agent, or Firm—Stanley Z. Cole; Kenneth L. Warsh

[57] ABSTRACT

A planar magnetron etching device having a movable magnetic source which is moved with respect to a substrate to cause lines magnetic flux parallel to the surface of the substrate to sweep above the surface of the substrate during the etching process.

16 Claims, 11 Drawing Figures

U.S. Patent    Nov. 12, 1985    Sheet 1 of 4    4,552,639
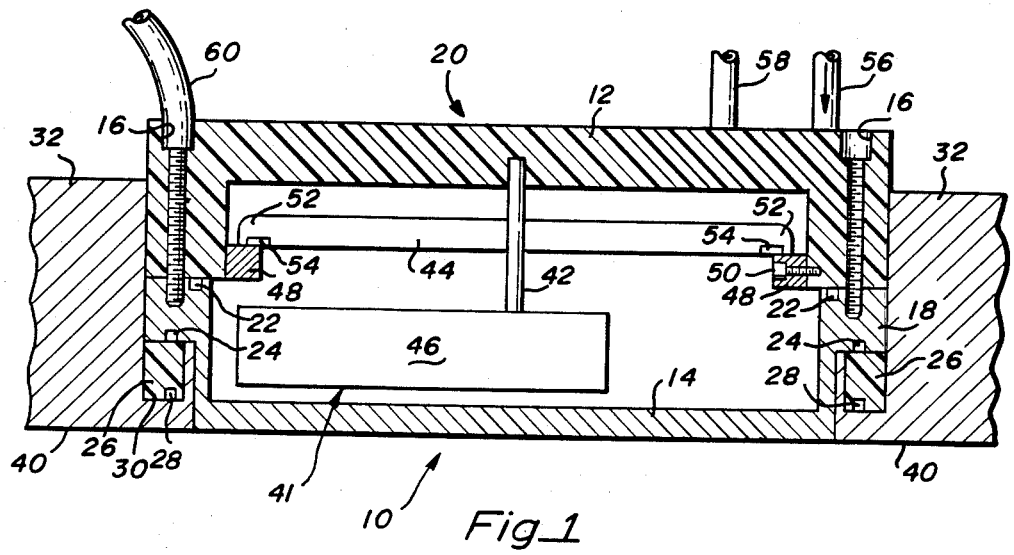
Fig_1
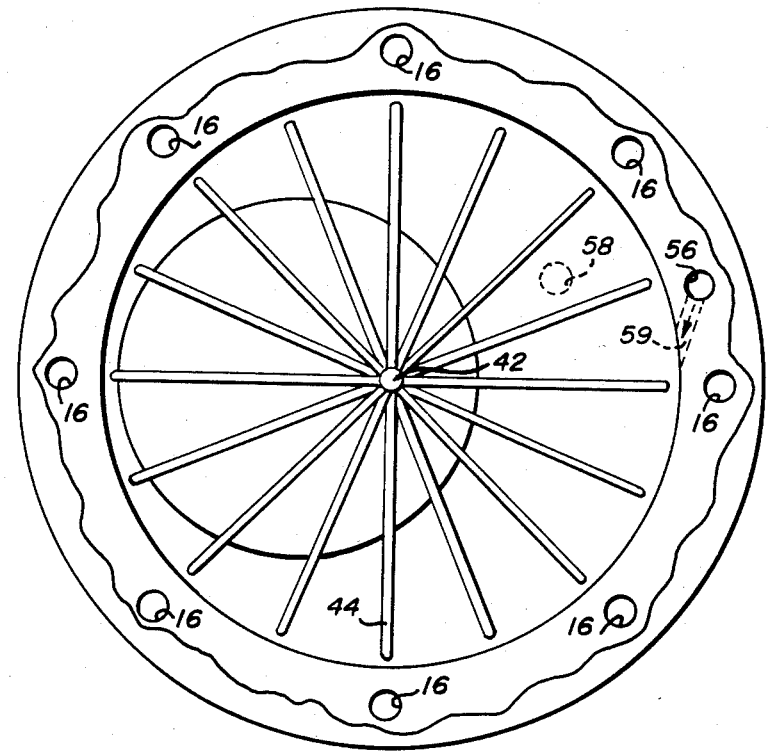
Fig_2

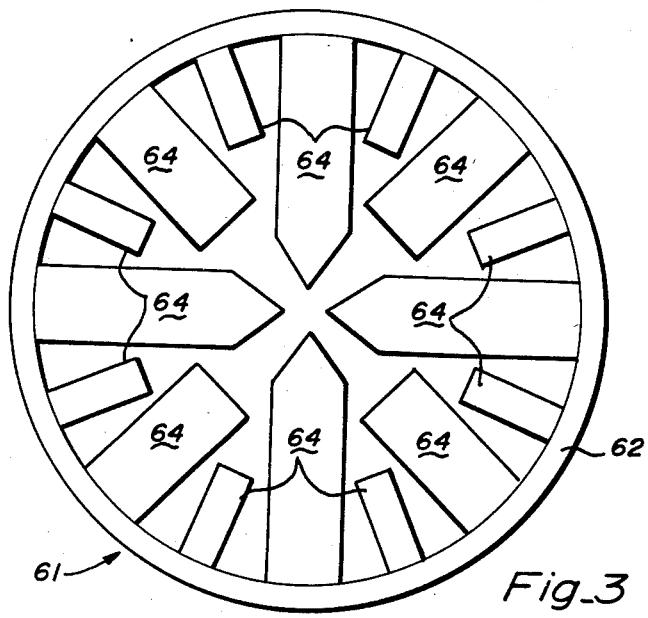
Fig_3
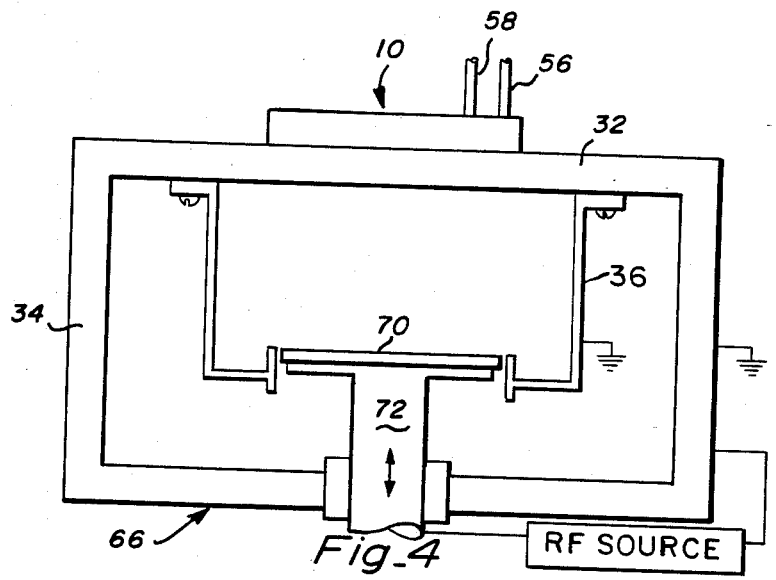
Fig_4
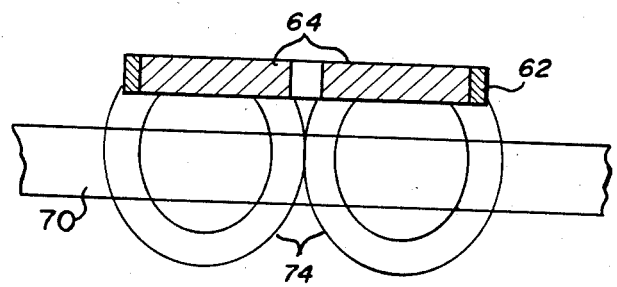
Fig_5

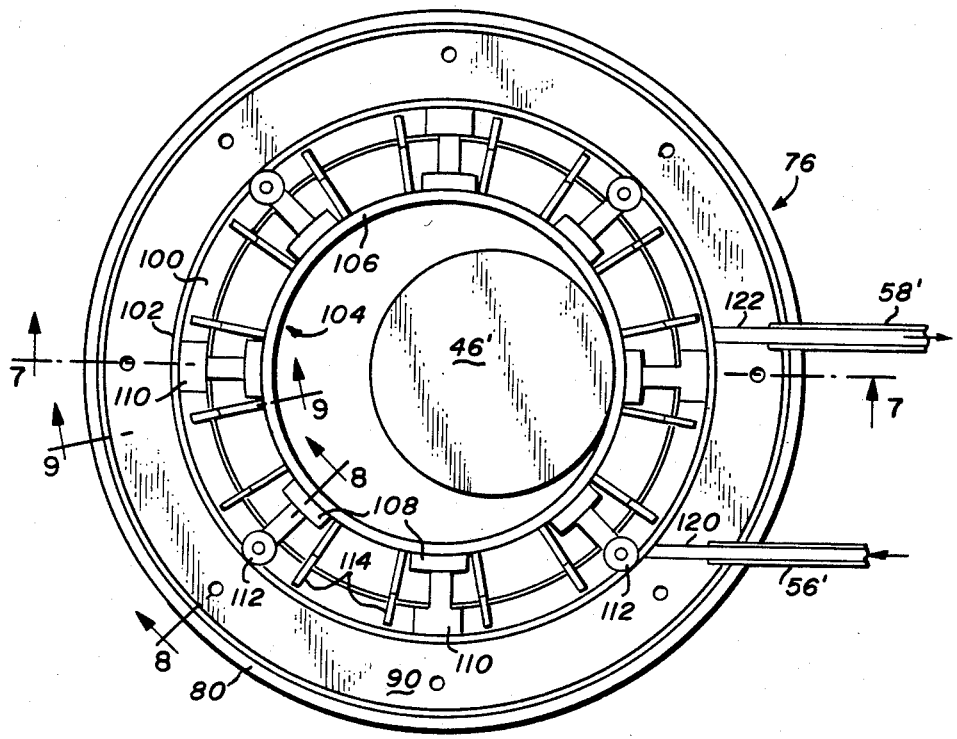
Fig_6
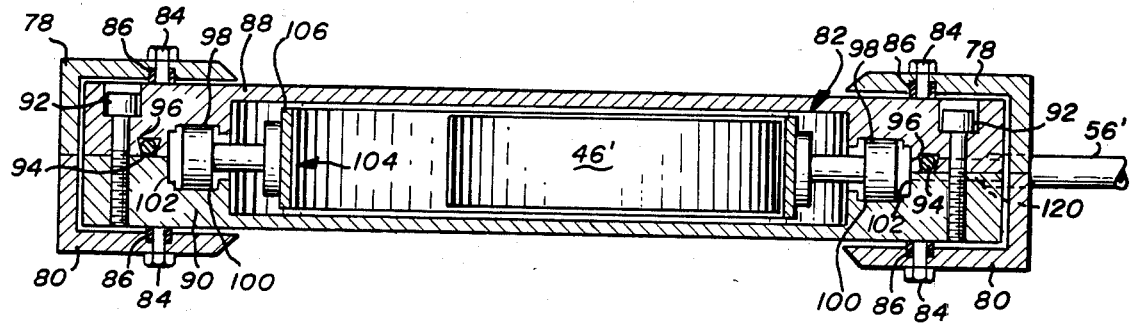
Fig_7
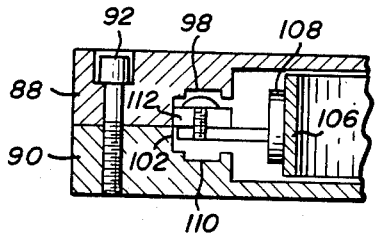
Fig_8
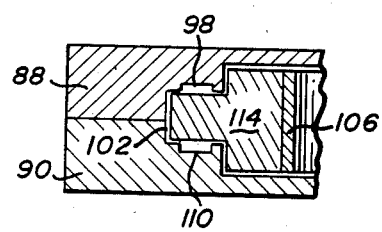
Fig_9

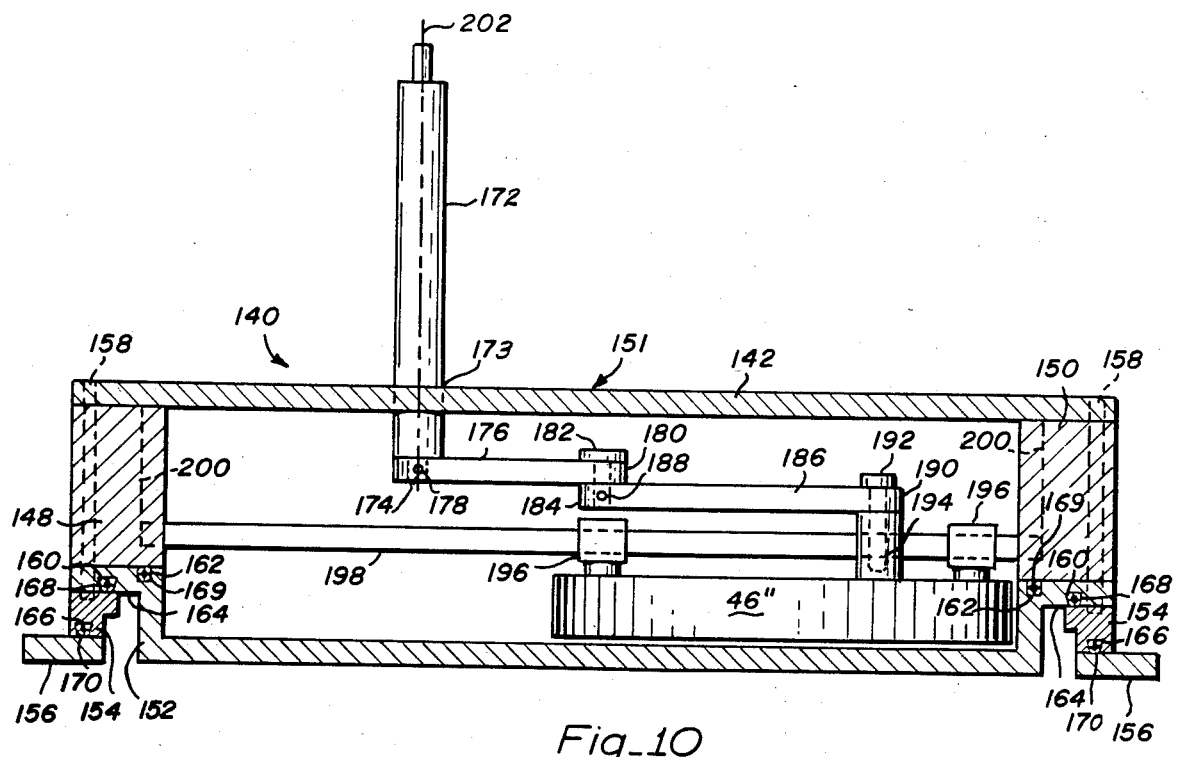
Fig_10
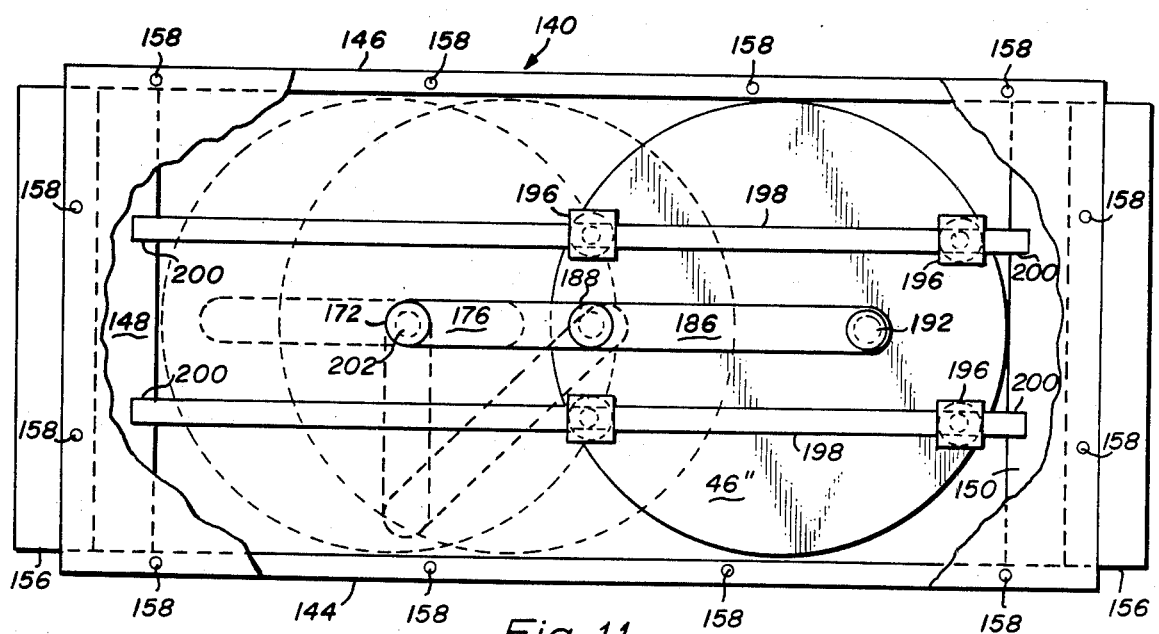
Fig_11

MAGNETRON SPUTTER ETCHING SYSTEM

This application is a continuation of application Ser. No. 632,790 filed July 20, 84, now abandoned.

BACKGROUND OF THE INVENTION

1. Field of the Invention

This invention relates generally to magnetron sputter etching devices and more particularly to a planar magnetron etching device with a moving magnetic field to provide benefits such as excellent uniformity in etching, and simplicity and versatility in construction and use.

2. Description of the Prior Art

Devices by which substrates are RF etched are well known. A substrate is placed in an inert gas environment which is subject to a magnetic field. RF is applied, resulting in the etch of material from the substrate. Since the development of this technology, it has been an objective to increase the uniformity of etching.

It is well known that maximum erosion of a substrate occurs where lines of magnetic flux are parallel with the surface of the substrate. The magnetic flux is provided by magnets located in proximity to the substrate. Magnetic lines of flux typically form closed loops extending from one pole of a magnet to the opposite pole. Where the magnetic field remains stationary during the etching process the maximum erosion of the substrate takes the form of a groove in the substrate. Typically such grooved erosion patterns are in the form of a race track but depend on the location of the stationary magnets with respect to substrate surface.

SUMMARY OF THE INVENTION

It is therefore an object of the present invention to provide an improved magnetron etching device which increases the uniformity of etching, and provides simplicity and versatility in use and construction.

Briefly, a preferred embodiment of the present invention includes a magnet assembly which is rotated over a substrate thereby creating a magnetic field pattern which is constantly changing with respect to any particular location on the substrate's surface. A circular magnet assembly is attached to an arm which is connected to a rotating shaft driven by an axial vaned water wheel such that the magnet assembly is eccentric to the rotating shaft. The magnet assembly is moved above the surface of a substrate. The substrate is in a process chamber which has been evacuated and into which a low pressure atmosphere of an inert gas has been introduced. If reactive ion etching is desired, a reactive gas can be employed. An RF voltage is applied to the substrate holder creating an RF field between the substrate and the process chamber. Electrons are removed from the substrate and in turn ionize the gas. Gas ions impact the substrate dislodging atoms or molecules of the substrate material. When an etching device uses the rotating magnet assembly, the substrate is uniformly etched.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a cross-sectional view of a water driven magnet assembly in accordance with the present invention;

FIG. 2 is a top elevational view of the water driven magnet assembly of FIG. 1;

FIG. 3 is a top elevational view of a ring and magnet subassembly;

FIG. 4 is a front view of a planar magnetron etching device of the present invention with the front wall removed;

FIG. 5 is a partial cross-sectional view of the magnet subassembly;

FIG. 6 is a top view of a first alternative embodiment with the upper mounting plate removed;

FIG. 7 is a cross-sectional view of the alternative embodiment of FIG. 6 taken along line 7—7;

FIG. 8 is a cross-sectional view of the alternative embodiment of FIG. 6 taken along line 8—8;

FIG. 9 is a cross-sectional view of the alternative embodiment of FIG. 6 taken along line 9—9;

FIG. 10 is a front view of a second alternative embodiment with the front cover removed; and FIG. 11 is a top view of the alternative embodiment of FIG. 10.

DETAILED DESCRIPTION OF THE PREFERRED EMBODIMENT

In FIG. 1, there is illustrated a water driven magnet assembly referred to by the general reference numeral 10. The magnet assembly 10 includes an insulating cap 12 which is rigidly attached to a lipped mounting plate 14 by a plurality of fasteners 16 (see also FIG. 2). The fasteners 16 extend through insulating cap 12 and into a lip 18 of mounting plate 14 to form a magnetic housing assembly referred to by general reference numeral 20. The lip 18 of mounting plate 14 is grooved on its upper and lower surfaces to receive gaskets 22 and 24. The magnet housing assembly 20 rests on an insulating ring 26 which is grooved on its lower side to receive a gasket 28. The insulating ring 26 in turn rests in a circumferential slot 30 in a process chamber top 32 (see also FIG. 4). The weight of the magnet housing assembly 20 holds it in place and it is sealed by a lower than atmospheric pressure maintained in a process chamber 34 (see FIG. 4) during the operation of the device.

Within the magnet housing assembly 20 is mounted a magnet drive assembly referred to by the general reference numeral 41. The drive assembly 41 consists of a drive shaft 42 rotatably mounted in insulating cap 12. A multi-vaned paddle wheel 44 is rigidly attached to drive shaft 42. Below multi-vaned paddle wheel 44 on drive shaft 42 is mounted an encased magnet subassembly 46. The magnet drive assembly 41 is supported by and rides on a bearing ring 48 which is attached to insulating cap 12 by a plurality of fasteners 50 (only one shown). The outer end 52 of each vane of multi-vaned paddle wheel 44 is fitted with a nylon roller 54 which rides on bearing ring 48 when the magnet drive assembly 41 is rotated.

A coolant inlet 56 and coolant outlet 58 are connected to passages in insulating cap 12. The direction of flow is shown in FIG. 2 by an arrow in a passage 59 connected to inlet 56. The inlet coolant passage through insulating cap 12 is arranged such that the coolant enters the magnet housing assembly 20 so that it impinges on multi-vaned paddle wheel 44 at the mid-point of outer end 52.

Referring to FIG. 3, a magnet and ring subassembly 61 is shown comprising a magnetically permeable ring 62 with a plurality of permanent magnets 64 arranged radially inward about the inner circumference of ring 62. The arrangement of the magnets is symmetric such that each magnet 64 is paired with another on a diameter of the ring 62. The magnets 64 can be arranged such that similar poles are toward the center of ring 62 or such that alternating poles are toward the center. The magnetic attraction of the ring 62 to the magnets 64 will hold them in their general positions. In order to fix the magnets 64 positions more permanently, any type of metal glue or epoxy can be used. The magnets 64 may also be arranged in a conical shape as well as being arranged in the same plane.

The magnet and ring subassembly 61 is encased in stainless steel to form the encased magnet subassembly 46. Such encapsulization inhibits corrosion when subassembly 46 is immersed in coolant which is typically water.

As illustrated in FIG. 4, the water driven magnet assembly 10 is part of a planar magnetron etching device referred to by general reference numeral 66 including a process chamber 34. The magnet assembly 10 is directly above and in a parallel plane to a substrate 70. Where the magnet assembly 10 and substrate 70 are circular, they are located concentrically. The substrate 70 is supported by a pneumatic pedestal 72. The process chamber 34 is fitted with conventional loading and unloading vacuum type doors (not shown) and with an evacuation means and in inert gas supply means (not shown).

The substrate 70 is positioned within the process chamber 68 on pedestal 72 directly beneath the magnet assembly 10. A vacuum is drawn on the process chamber 68 and then an inert gas at a low pressure is introduced into the process chamber 68. Coolant under pressure is permitted to enter the magnet housing assembly 20 through coolant inlet 56. The coolant then performs two functions. First, it removes heat generated during operation of the etching device 66 which is transferred to the coolant through lipped mounting plate 14. The coolant performs its second function by impinging on multi-vaned paddle wheel 44 which causes it to turn. The coolant then exits the magnet housing assembly 20 through coolant outlet 58.

The rotation of the multi-vane paddle wheel 44 causes the drift shaft 42 to turn which causes the encased magnet subassembly 46 to be moved in a translational and/or rotational pattern. As shown in FIG. 2 the connection between drive shaft 42 and encased magnet subassembly 46 is such as to impart eccentric rotation. The encased magnet subassembly 46 moves in a parallel plane to the substrate 70. Lines of magnetic flux are produced by the magnets 64 within the encased magnet subassembly 46. These lines of magnetic flux form closed looped pairs 74 extending from one pole on a magnet 64 to its opposite pole. The loop pairs 74 pass through and over the substrate 70 as illustrated in FIG. 5. The axial arrangement of magnets 64 within the magnet and ring subassembly 61 causes the creation of a series of loop pairs 74 in planes normal to the plane of the substrate 70 and along diameters through pairs of magnets 64.

With the encased magnet subassembly 46 in motion and the resulting lines of magnetic flux being swept over the surface of the substrate 70, an RF voltage is applied to the pedesteal 72 and thus to substrate 70 establishing an RF field between the chamber 34 and substrate 70. The inert gas is ionized by electrons from the substrate 70 and such ions impact the substrate 70 causing atoms or molecules of substrate material to be dislodged. Such substrate material is then deposited on the chamber wall 34. Since the lines of magnetic flux which are parallel to the plane of the substrate 70 are continuously moving above the substrate in a uniform manner, the substrate is depleted uniformly. In the etching use of the magnet system shown in FIG. 1 the plate 14 is grounded.

In an alternate embodiment a cylindrical collector shield 36 is formed at the center of the chamber 34 and electrically connected to the chamber 36. The substrate is raised into the collector shield before etching commences, thereby depositing the etched material on the inside of the collector shield 34 rather than the chamber 34.

The alternate embodiment illustrated in FIGS. 6 through 9 is a dual substrate auto-driven magnet assembly referred to by the general reference numeral 76 which includes an upper ground ring 78 and a lower ground ring 80 which are mounted about a magnet housing assembly referred to by general reference numeral 82. A plurality of fasteners 84 (only four shown) are used to accomplish the mounting. Said fasteners 84 are insulated from magnet housing assembly 82 by a plurality of insulators 86. An upper mounting plate 88 and a lower mounting plate 90 are joined together by a plurality of fasteners 92 to form magnetic housing assembly 82. A seal is formed between the upper and lower mounting plates 88 and 90 by an O-ring 94 installed in a groove 96 in upper mounting plate 88. The joiner of upper and lower mounting plates 88 and 89 forms an upper horizontal bearing groove 98, a lower horizontal bearing groove 100 and a vertical bearing groove 102. Within magnetic housing assembly 82 is mounted a multi-vaned paddle wheel referred to by general reference numeral 104 which comprises a ring 106, a plurality of bearing assembly mounts 108, a plurality of horizontal roller bearing assemblies 110, a plurality of vertical roller bearing assemblies 112 and a plurality of vanes 114.

An encased magnet subassembly 46' is attached to the inner surface of said ring 106 such that the encased magnet subassembly 46' is eccentric to said ring 106. The encased magnet subassembly 46' is of similar construction as encased magnet subassembly 46 as described above and illustrated in FIGS. 1 through 3. A coolant inlet 56' and a coolant outlet 58' are connected to two passages 120 and 122, respectively, in the magnet housing assembly 82 such that coolant entering assembly 82 impinges on vanes 114. The dual substrate auto-driven magnet assembly 10 can be mounted so that substrates are in either the horizontal or vertical plane within a process chamber with the RF power available. More than one dual substrate water driven magnet assembly 76 can be mounted within the process chamber such that more than two substrates can be etched simultaneously.

When coolant under pressure is introduced at coolant inlet 56' the coolant impinges on vanes 114 causing the multi-vaned paddle wheel 104 to rotate. When the dual substrate auto-driven magnet assembly 76 is oriented such that the substrates are in a horizontal plane, the paddle wheel rides on horizontal roller bearing assemblies 110 in upper and lower horizontal bearing grooves 98 and 100. When assembly 10 is oriented vertically, paddle wheel 104 rides on vertical roller bearing assemblies 112 and vertical bearing groove 102. When paddle wheel 104 rotates it causes encased magnet subassembly 46' to eccentrically rotate, thus sweeping the magnetic field created over the surfaces of substrates resulting in the uniform etching of substrates in a manner similar to that described above.

A second alternative embodiment is illustrated in FIGS. 10 and 11. A translational magnet assembly referred to by the general reference numeral 140 includes a top cover 142, a front cover 144, a back cover 146, a first side piece 148, a second side piece 150, a bottom mounting platge 152, an insulator 154 and a process chamber mount 156. The top cover 142 is fastened to the bottom mounting plate 152 and insulator 154 by a plurality of fasteners 158 which pass through front cover 144, back cover 146, afirst side piece 148 and second side piece 150 creating a magnet housing assembly 151.

A first and a second O-ring groove 160 and 162 is provided on lipped portion 164 of bottom mounting plate 152. A third O-ring groove 166 is provided on insulator 154. Each of O-ring grooves 160, 162 and 166 contain O-rings 168, 169 and 170, respectively, such that a seal is formed between bottom mounting plate 152 and insulator 154 and between insulator 154 and process chamber mount 156.

A shaft 172 extends into magnet housing assembly 151 through a penetration 173 in top cover 142. The axis of shaft 172 is perpendicular to the plane of bottom mounting plate 152 and is located on the longitudinal center line of magnet housing assembly 151. A lower end 174 of shaft 172 is adapted to extend through a first end 175 of a first linkage 176 which is in a plane parallel to the plane of the bottom mounting plate 152. A first pin 178 extends through first linkage 176 and lower end 174 such that there is no relative motion permitted between shaft 170 and first linkage 176.

A second end 180 of first linkage 176 is adapted to receive a second pin 182 which passes through first linkage 176 and into a first end 184 of a second linkage 186. A third pin 188 extends through the first end 184 of second linkage 186 and second pin 182 such that first linkage 176 may pivot about second pin 182. A second end 190 of second linkage 186 is adapted to receive a fourth pin 192 which is secured in a receptacle 194 which is rigidly mounted on an encased magnet subassembly 46″ such that second linkage 186 may pivot about fourth pin 192. Encased magnet subassembly 46″ is of similar construction as encased magnet subassembly 46 described above and illustrated in FIGS. 1, 2 and 3.

A plurality of guide shaft receivers 196 are rigidly mounted on encased magnet subassembly 46″ such as to slidingly receive a pair of guide shafts 198. Guide shafts 198 are mounted in a plurality of slots 200 in first and second side pieces 148 and 150.

During operation, shaft 172 is connected to a rotating means such that shaft 172 is rotated about a longitudinal axis 202. Such rotation causes first linkage 176 to pivot about said longitudinal axis 202 in a plane substantially parallel to the plane of bottom mounting plate 152.

As first linkage 176 pivots, it pulls second linkage 186 such that a force is exerted on encased magnet subassembly 46″ through fourth pin 192 and receptacle 194. Since the motion of encased magnet subassembly 46 is restricted by guide shafts 198 through guide shaft receivers 196, the force exerted on encased magnet subassembly 46″ causes translation of subassembly 46″.

As first linkage 176 continues to pivot, encased magnet subassembly 46″ is moved as shown in phantom on FIG. 11 such that upon one complete rotation of first linkage 176 about longitudinal axis 202, encased magnet subassembly 46″ will have been moved completely across and over the substrate and returned to its original position as illustrated in FIG. 10. The motion of encased magnet subassembly 46″ is repeated as shaft 172 continues to rotate. Thus, the magnetic field created by encased magnet subassembly 46″ is swept over the substrate resulting in uniform etching of the substrate. In operation, translational magnet assembly 140 would be supplied with appropriate electrical power and coolant means so as to function as an RF magnetron. Assembly 140 would also be mounted and sealed over an aperture in a process chamber such as that described as process chamber in proximity to and parallel to the substrate.

Another alternative embodiment uses a plurality of encased magnet subassemblies driven by a common shaft in an eccentric manner. The size of the rings 62 and the magnets 64 therein can vary and is not limited to the sizes and numbers shown in the drawings. However, the typical size of the substrates to be etched range between three and five inches in diameter. However, this is based totally on the needs of industry and is not a limit on the capability of the present invention.

Although the water-driven drive of the present invention is convenient in that it performs two functions, it should not be interpreted as the only means for producing movement of the magnetic source. Besides hydraulic, the drive means may be electrical or magnetic. The speed of the drive can be controlled in the present invention by increasing or reducing the flow of coolant to the magnet housing assembly 20.

In order to protect the device from overheating, a water/rotation interlock can be provided to interrupt the RF power supply if there is no rotation of drive shaft 42 or no water flow through coolant inlet 56.

The motion of the magnetic source may, in an alternative embodiment, be random in nature as opposed to the uniform motion. It should also be noted that the plane of the magnetic source may be raised or lowered with respect to the substrate by adjusting the length of the drive shaft 42 or operating without the bearing ring 48 and nylon rollers 54, thereby allowing encased magnet subassembly to be in contact with the upper surface of lipped mounting plate 14.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A magnetron etching device, comprising in combination, a low pressure gas chamber for positioning an object having a surface to be etched;

means for creating an electrical field between said surface to be etched and a collector surface means;

a magnetic source connected to a means for moving said magnetic source with respect to the object to be etched, such that the lines of magnetic flux created move above the etch surface of the object to be etched, said magnetic source being spaced from said object when said object is positioned in said gas chamber and said magnetic source being located on the etch surface side of the object to be etched;

means for injecting an inert gas into said chamber;

whereby the etched material may be transferred from the object to the collector surface means and the motion of the magnetic source can etch the object uniformly.

2. The device of claim 1 further including, a plurality of magnetic sources, each of which is movable relative to the surface to be etched.

3. The device of claim 1 wherein:

the means for moving the magnetic source include means for moving the magnetic source in random motions.

4. The device of claim 1 wherein:

the means for moving the magnetic source include means for moving the magnetic source in a circular path.

5. The device of claim 1 wherein:

said means for creating an electrical field is a means for creating an RF electrical field.

6. The device of claim 5 wherein:

the magnetic source is a plurality of permanent magnets radially oriented within a magnetically permeable ring encased in stainless steel and connected to a drive shaft driven by vanes adapted to be struck by a flow of coolant to cause the eccentric rotation of said magnetic source.

7. The device of claim 5 wherein:

said object to be etched comprises a pair of planar substrates oriented in substantially parallel planes with said magnetic source intermediate to and in a parallel plane with said planar substrates.

8. The device of claim 7 wherein:

more than one pair of said substrates and magnetic source associated herewith may be located within said low pressure inert gas chamber.

9. The device of claim 5 wherein:

said means for moving the magnetic source causes translational motion of said magnetic source.

10. A planar magnetron etching device comprising, in combination:

magnetic means for providing fringing magnetic field lines;

means for receiving said magnetic means and moving said magnetic means;

means for supporting a substrate such that one surface of the substrate is exposed for etching;

said support means being positioned relative to said magnetic means such that when a substrate is supported by said supporting means the exposed etch surface of the substrate faces said magnetic means, whereby said magnetic means projects magnetic field lines into the space adjacent the exposed etch surface of the substrate without first passing through the substrate;

means for applying an electrical field to the substrate;

a process chamber in which the substrate is located;

means for evacuating said process chamber; and means for injecting an etch gas into the process chamber whereby said magnetic means may be moved relative to the substrate to cause the lines of magnetic flux to move relative to the surface of the substrate at the same time the electrical field is applied in a low pressure environment of the etch gas, and the substrate may be uniformly etched.

11. The device of claim 10 wherein:

the means for moving the magnetic means is a hydraulic pressure source positioned to act on a multi-vane.

12. The device of claim 10 wherein:

the means for moving the magnetic means is an electric motor.

13. The device of claim 10 wherein:

the magnetic means includes a plurality of permanent magnets arranged as radial spokes within a retaining ring.

14. The device of claim 10 wherein:

the permanent magnets are arranged with alternating poles towards a center of the retaining ring.

15. The device of claim 10 wherein:

said means for applying an electrical field is a means for applying an RF electrical field.

16. The device of claim 10 wherein:

said means for supporting a substrate includes means for moving the substrate relative to said magnetic means.

* * * * *